(12) United States Patent
Tucker

(10) Patent No.: US 10,878,682 B1
(45) Date of Patent: Dec. 29, 2020

(54) SMOKE DETECTOR

(71) Applicant: Ronald Tucker, Ellenwood, GA (US)

(72) Inventor: Ronald Tucker, Ellenwood, GA (US)

( * ) Notice: Subject to any disclaimer, the term of this patent is extended or adjusted under 35 U.S.C. 154(b) by 0 days.

(21) Appl. No.: 16/538,940

(22) Filed: Aug. 13, 2019

(51) Int. Cl.
| | | |
|---|---|---|
| *G08B 17/11* | (2006.01) | |
| *G08B 25/10* | (2006.01) | |
| *G08B 17/113* | (2006.01) | |
| *G08B 25/01* | (2006.01) | |
| G08B 17/117 | (2006.01) | |
| G08B 3/10 | (2006.01) | |
| H04W 4/14 | (2009.01) | |
| H05K 5/02 | (2006.01) | |
| H04W 4/90 | (2018.01) | |
| H05K 5/00 | (2006.01) | |

(52) U.S. Cl.
CPC ............ *G08B 17/11* (2013.01); *G08B 17/113* (2013.01); *G08B 25/01* (2013.01); *G08B 25/10* (2013.01); *G08B 3/10* (2013.01); *G08B 17/117* (2013.01); *H04W 4/14* (2013.01); *H04W 4/90* (2018.02); *H05K 5/0017* (2013.01); *H05K 5/0204* (2013.01)

(58) Field of Classification Search
CPC ........ G08B 17/06; G08B 17/10; G08B 17/11; G08B 17/113; G08B 25/01; G08B 25/014; G08B 25/08; G08B 25/10; G08B 25/14; G08B 17/117

See application file for complete search history.

(56) References Cited

U.S. PATENT DOCUMENTS

| | | | | |
|---|---|---|---|---|
| 3,767,917 A | * | 10/1973 | Lampart | G08B 17/113 250/384 |
| 7,019,646 B1 | | 3/2006 | Woodard | |
| 9,460,611 B2 | | 10/2016 | Emerson | |
| D814,955 S | | 4/2018 | Bolger | |
| 2006/0139160 A1 | | 6/2006 | Lin | |
| 2011/0234396 A1 | | 9/2011 | Olenick | |
| 2012/0229283 A1 | * | 9/2012 | McKenna | G08B 25/10 340/584 |
| 2015/0077240 A1 | * | 3/2015 | Eck | G08B 3/10 340/501 |
| 2016/0188977 A1 | * | 6/2016 | Kearns | G05D 1/0274 348/113 |
| 2016/0225243 A1 | * | 8/2016 | Albass | H04W 4/029 |
| 2020/0119457 A1 | * | 4/2020 | Fried | H01Q 1/246 |

FOREIGN PATENT DOCUMENTS

WO     2011119844     9/2011

\* cited by examiner

*Primary Examiner* — Van T Trieu

(57) ABSTRACT

The improved smoke detector is an alarm. The improved smoke detector monitors the atmosphere for both smoke and an increase in temperature consistent with the presence of a combustion reaction such as a fire. The improved smoke detector communicates an alarm message to an appropriate authority over a commercially provided and publicly available cellular wireless network. The alarm message informs the appropriate authority of the combustion reaction. The improved smoke detector comprises a housing and a control circuit. The housing contains the control circuit. The control circuit monitors the atmosphere for both smoke and an increase in temperature. The control circuit transmits the alarm message to the appropriate authority.

16 Claims, 4 Drawing Sheets

SMOKE DETECTOR

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of physics and signaling including alarm systems, more specifically, a personal emergency security system in which the location of the alarm condition is signaled to a central station. (G08B25/016)

SUMMARY OF INVENTION

The improved smoke detector is an alarm. The improved smoke detector monitors the atmosphere for both smoke and an increase in temperature consistent with the presence of a combustion reaction such as a fire. The improved smoke detector communicates an alarm message to an appropriate authority over a commercially provided and publicly available cellular wireless network. The alarm message informs the appropriate authority of the combustion reaction. The improved smoke detector comprises a housing and a control circuit. The housing contains the control circuit. The control circuit monitors the atmosphere for both smoke and an increase in temperature. The control circuit transmits the alarm message to the appropriate authority.

These together with additional objects, features and advantages of the improved smoke detector will be readily apparent to those of ordinary skill in the art upon reading the following detailed description of the presently preferred, but nonetheless illustrative, embodiments when taken in conjunction with the accompanying drawings.

In this respect, before explaining the current embodiments of the improved smoke detector in detail, it is to be understood that the improved smoke detector is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the improved smoke detector.

It is therefore important that the claims be regarded as including such equivalent construction insofar as they do not depart from the spirit and scope of the improved smoke detector. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
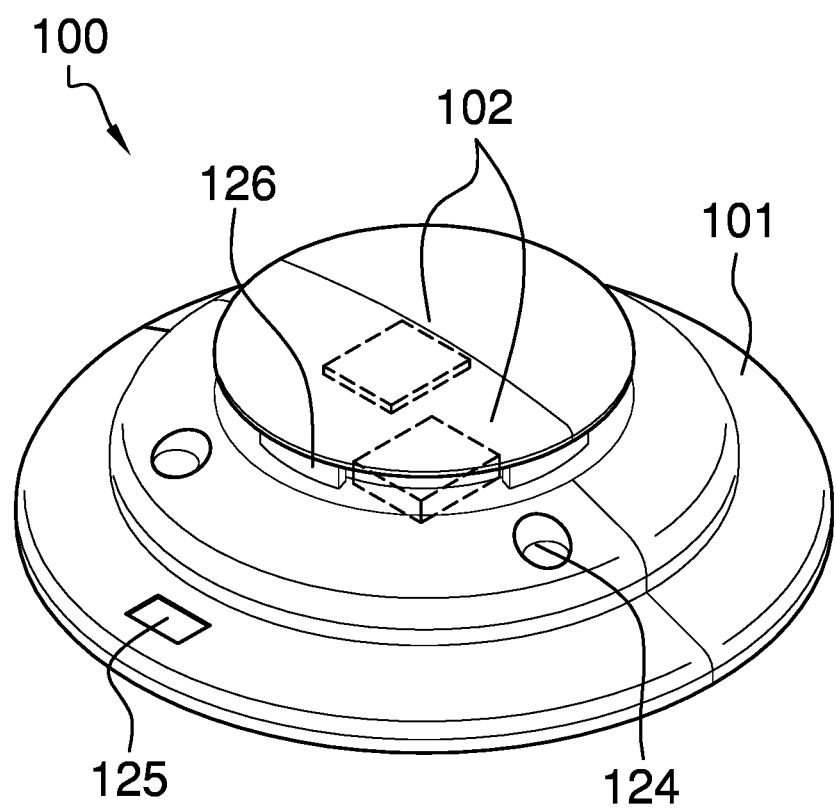
FIG. 1 is a perspective view of an embodiment of the disclosure.
Figure 2:
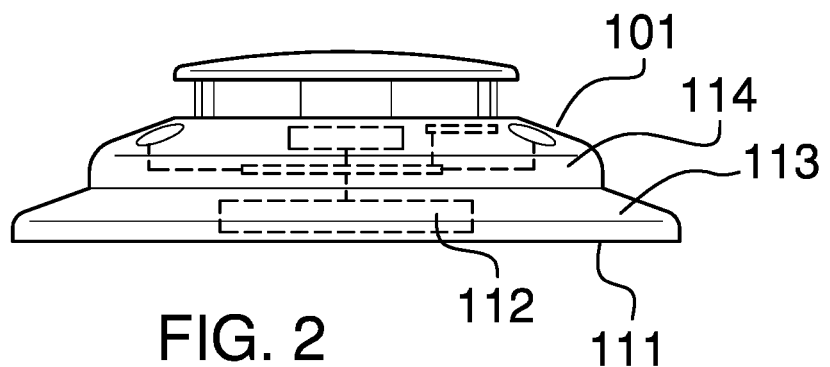
FIG. 2 is a side view of an embodiment of the disclosure.
Figure 3:
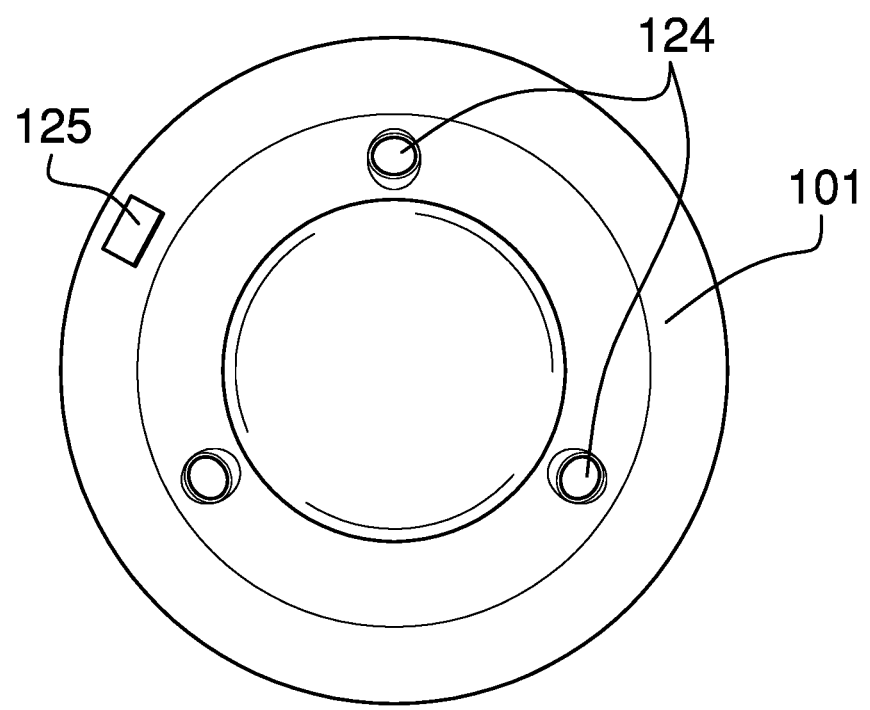
FIG. 3 is a front view of an embodiment of the disclosure.
Figure 4:
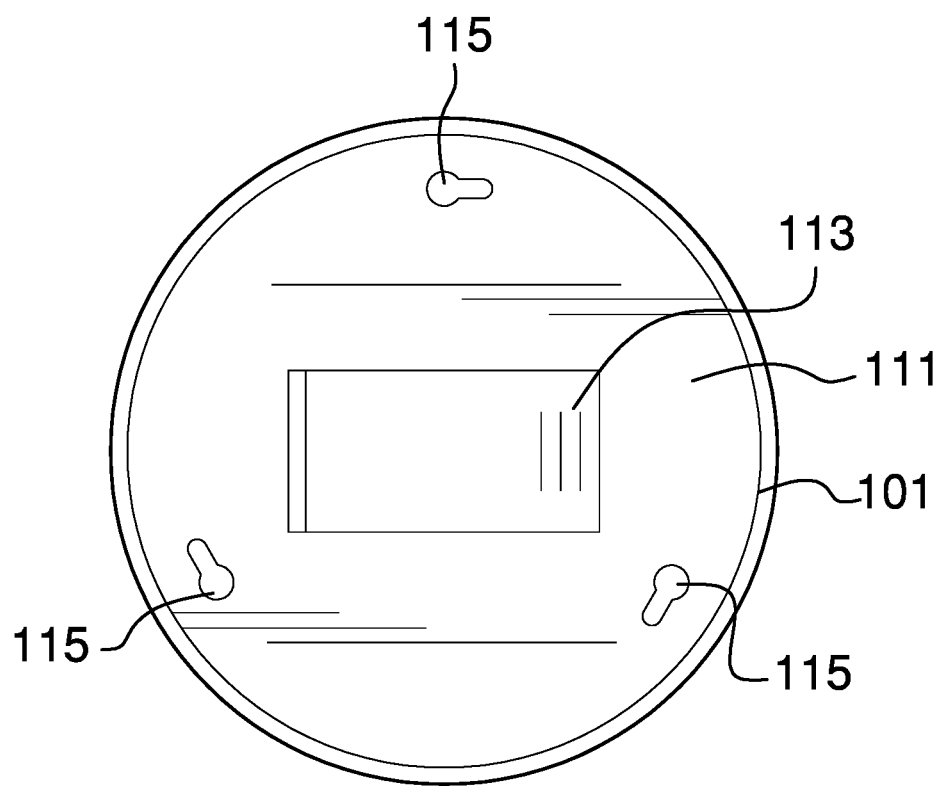
FIG. 4 is a rear view of an embodiment of the disclosure.
Figure 5:
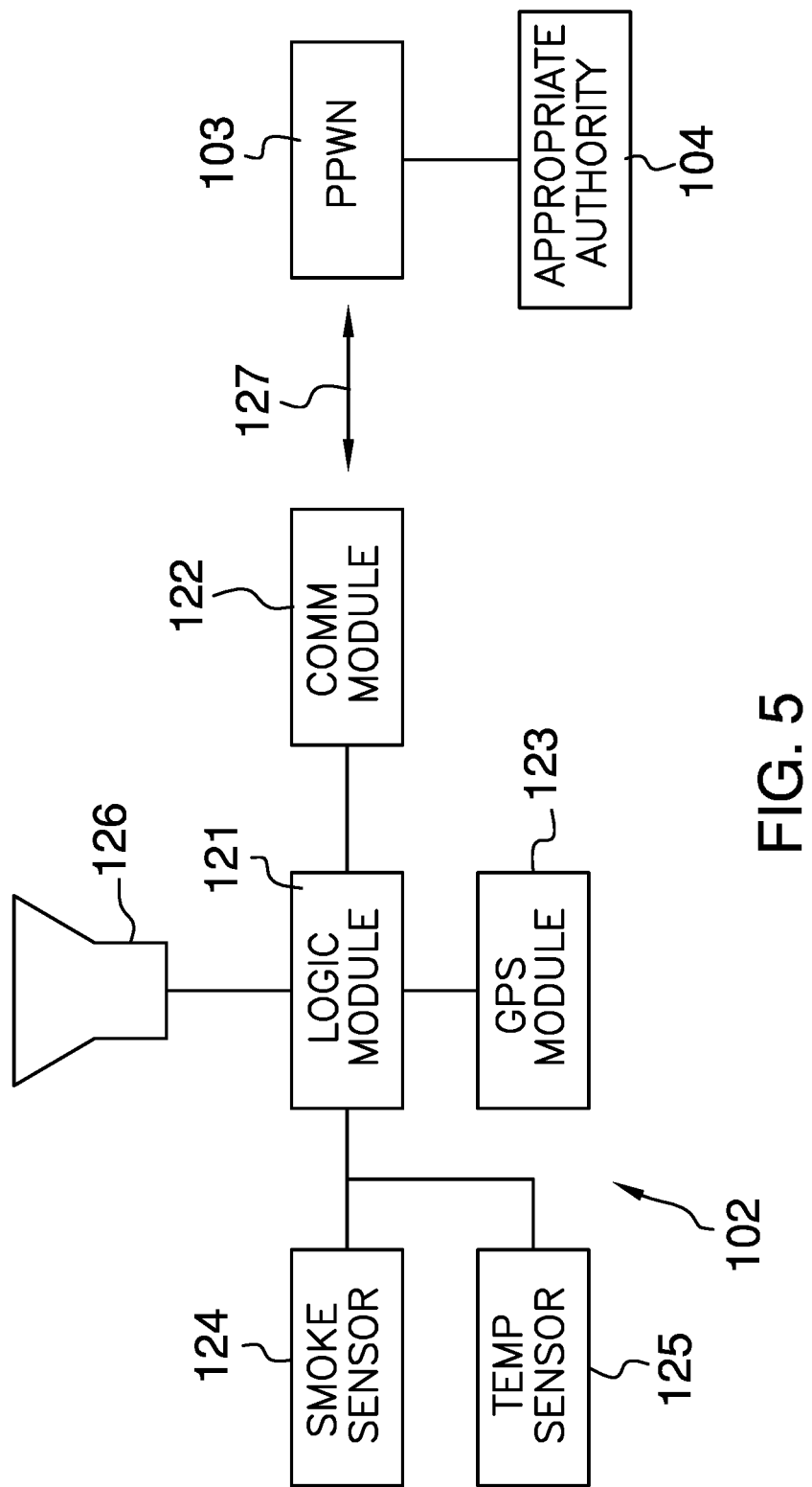
FIG. 5 is a block diagram of an embodiment of the disclosure.

Detailed reference will now be made to one or more potential embodiments of the disclosure, which are illustrated in FIGS. 1 through 5.

The improved smoke detector 100 (hereinafter invention) is an alarm. The invention 100 monitors the atmosphere for both smoke and for an increase in temperature consistent with the presence of a combustion reaction such as a fire. The invention 100 communicates an alarm message to an appropriate authority 104 over a commercially provided and publicly available cellular wireless network 103. The alarm message informs the appropriate authority 104 of the combustion reaction. The invention 100 comprises a housing 101 and a control circuit 102. The housing 101 contains the control circuit 102. The control circuit 102 monitors the atmosphere for both smoke and for an increase in temperature. The control circuit 102 transmits the alarm message to the appropriate authority 104. The commercially provided and publicly available cellular wireless network 103 is defined elsewhere in this disclosure. The appropriate authority 104 is defined elsewhere in this disclosure.

The housing 101 is a rigid structure. The housing 101 is a hollow structure. The housing 101 contains the control circuit 102. The housing 101 is formed with all apertures and form factors necessary to allow the housing 101 to accommodate the use, the operation, and the external connections of the control circuit 102. Methods to form a housing 101 suitable for the purposes described in this disclosure are well-known and documented in the mechanical arts. The housing 101 comprises a mounting surface 111, a battery 112, a battery 112 chamber 113, and a circuit chamber 114.

The mounting surface 111 is an exterior Euclidean surface formed on the housing 101. The mounting surface 111 is placed against a vertical surface that forms the load path that supports the load of the invention 100.

The battery 112 is an electrochemical device. The battery 112 converts chemical potential energy into the electrical energy used to power the control circuit 102.

The battery 112 chamber 113 is a space that is formed within the housing 101. The battery 112 chamber 113 contains the battery 112 such that the battery 112 can be removed and replaced as necessary. The circuit chamber 114 is a space that is formed within the housing 101. The circuit chamber 114 contains the control circuit 102 of the invention 100.

Each of the plurality of keyholes 115 is a keyhole structure that is formed in the mounting surface 111. Each of the plurality of keyholes 115 is used to mount the housing 101 to a vertical surface. The use of a keyhole for this purpose is well-known and documented in the mechanical arts. The keyhole is further defined elsewhere in this disclosure.

The control circuit 102 is an electric circuit. The control circuit 102 monitors the atmosphere for smoke. The control circuit 102 monitors the temperature of the atmosphere. The control circuit 102 generates an audible alarm when the control circuit 102 determines that an alarm condition exists. The alarm condition is determined by a factor selected from the group consisting of: a) the measured smoke in the atmosphere is consistent with a combustion reaction; b) the measured temperature of the atmosphere is consistent with a combustion reaction; and, c) the measured temperature of the atmosphere in combination with the measured temperature of the atmosphere is consistent with a combustion reaction. The control circuit 102 transmits an SMS message containing an alarm message and the GPS coordinates of the control circuit 102 to an appropriate authority 104 when the control circuit 102 determines that an alarm condition exists.

The control circuit 102 comprises a logic module 121, a communication module 122, a GPS module 123, a smoke sensor 124, a temperature sensor 125, a speaker 126, and a wireless communication link 127. The logic module 121, the communication module 122, the GPS module 123, the smoke sensor 124, and the temperature sensor 125, and the speaker 126 are electrically interconnected. The communication module 122 creates the wireless communication link 127.

The logic module 121 initiates the transmission of an SMS message indicating an alarm condition and the GPS coordinates of the GPS module 123 to the appropriate authority 104 when an alarm condition is detected. The logic module 121 transmits the SMS message to the appropriate authority 104 using the communication module 122 and the commercially provided and publicly available cellular wireless network 103.

The logic module 121 is a readily and commercially available programmable electronic device that is used to manage, regulate, and operate the control circuit 102. The communication module 122 is a wireless electronic communication device that allows the logic module 121 to wirelessly communicate with a commercially provided and publicly available cellular wireless network 103.

The communication module 122 communicates SMS and MMS messages between the logic module 121 and the appropriate authority 104 through a commercially provided and publicly available cellular wireless network 103. The use of a commercially provided and publicly available cellular wireless network 103 is preferred because: 1) of its low cost; 2) of the widespread availability and the broad interoperability between competing commercially provided and publicly available cellular wireless networks 103; and, 3) methods and techniques to send SMS and MMS messages over a commercially provided and publicly available cellular wireless network 103 are well known and documented by those skilled in the electrical arts.

The GPS module 123 is an electrical device that communicates with the GPS to determine the GPS coordinates of the GPS module 123. When queried by the logic module 121, the GPS module 123 transfers the GPS coordinates to the logic module 121.

When the logic module 121 determines that a sensor selected from the group consisting of the smoke sensor 124 and the temperature sensor 125 indicate a condition consistent with a combustion reaction, the logic module 121 sense a text to the appropriate authority 104 using the communication module 122. In this scenario, the appropriate authority 104 is a local emergency services center configured to receive (E)911 text messages. The text to 911 message is a preprogrammed distress message stating that a combustion reaction is occurring and providing the GPS coordinates of the GPS module 123 at the time the distress message was initiated.

The smoke sensor 124 is a sensor. The logic module 121 controls the operation of the smoke sensor 124. The logic module 121 monitors the smoke sensor 124 to determine the level of smoke in the atmosphere. The logic module 121 determines whether an alarm condition exists based on the level of smoke measured in the atmosphere.

The temperature sensor 125 is a sensor. The logic module 121 controls the operation of the temperature sensor 125. The logic module 121 monitors the temperature sensor 125 to determine the temperature of the atmosphere. The logic module 121 determines whether an alarm condition exists based on the measured temperature of the atmosphere.

The speaker 126 is a transducer. The logic module 121 controls the operation of the speaker 126. The speaker 126 announces an audible alarm when the logic module 121 determines whether an alarm condition exists.

The following definitions were used in this disclosure:

Announce: As used in this disclosure, to announce means to generate audible sounds over a transducer.

Appropriate Authority: As used in this disclosure, an appropriate authority is a previously determined person or organization that is designated to send and receive alarm or other notification messages regarding a monitored system or activity.

Atmosphere: As used in this disclosure, the atmosphere refers to a blanket of gases (primarily nitrogen and oxygen) that surround the earth. Typical atmospheric conditions are approximated and characterized as the normal temperature and pressure. Atmospheric gases are commonly called air.

Battery: As used in this disclosure, a battery is a chemical device consisting of one or more cells, in which chemical energy is converted into electricity and used as a source of power. Batteries are commonly defined with a positive terminal and a negative terminal.

Combustion: As used in this disclosure, combustion refers to a reduction-oxidation reaction wherein oxygen and a hydrocarbon are combined to release energy, carbon dioxide, and water. In general usage, the meaning of combustion is often extended to describe a reaction between oxygen and a fuel source, such as a hydrocarbon modified by functional groups, which releases energy.

Commercially Provided And Publicly Available Cellular Wireless Network: As used in this disclosure, a commercially provided and publicly available cellular wireless network refers to subscription-based publically available wireless network commonly used to provide wireless communication access for personal data devices. The commercially provided and publicly available cellular wireless network will typically provide voice communication, data communication services, and SMS and MMS messaging services. The commercially provided and publicly available cellular wireless network is commonly referred to as the cellular network. The commercially provided and publicly available cellular wireless network is abbreviated as the PPWN.

Communication Link: As used in this disclosure, a communication link refers to the structured exchange of data between two objects.

Diameter: As used in this disclosure, a diameter of an object is a straight line segment (or a radial line) that passes through the center (or center axis) of an object. The line segment of the diameter is terminated at the perimeter or boundary of the object through which the line segment of the diameter runs. A radius refers to the line segment that overlays a diameter with one termination at the center of the object. A span of a radius is always one half the span of the diameter.

Disk: As used in this disclosure, a disk is a prism-shaped object that is flat in appearance. The disk is formed from two congruent ends that are attached by a lateral face. The sum of the surface areas of two congruent ends of the prism-shaped object that forms the disk is greater than the surface area of the lateral face of the prism-shaped object that forms the disk. In this disclosure, the congruent ends of the prism-shaped structure that forms the disk are referred to as the faces of the disk.

Euclidean Surface: As used in this disclosure, a Euclidean surface refers to a two-dimensional that is formed without a curvature.

Extension Structure: As used in this disclosure, an extension structure is an inert physical structure that is used to extend or bridge the reach between any two objects.

Force of Gravity: As used in this disclosure, the force of gravity refers to a vector that indicates the direction of the pull of gravity on an object at or near the surface of the earth.

Form Factor: As used in this disclosure, the term form factor refers to the size and shape of an object.

Gas: As used in this disclosure, a gas refers to a state (phase) of matter that is fluid and that fills the volume of the structure that contains it. Stated differently, the volume of a gas always equals the volume of its container.

GPS: As used in this disclosure, and depending on the context, GPS refers to: 1) a system of navigational satellites that are used to determine the position, known as GPS coordinates, and velocity of a person or object; 2) the system of navigational satellites referred to in the first definition that are used to synchronize to global time; or, 3) an electronic device or that uses the system of navigational satellites referred to in the first definition to determine the position of a person or object. GPS is an acronym for Global Positioning System. Methods to determine the distance and direction between any two sets of GPS coordinates are well-known and documented in the navigational arts.

Horizontal: As used in this disclosure, horizontal is a directional term that refers to a direction that is either: 1) parallel to the horizon; 2) perpendicular to the local force of gravity, or, 3) parallel to a supporting surface. In cases where the appropriate definition or definitions are not obvious, the second option should be used in interpreting the specification. Unless specifically noted in this disclosure, the horizontal direction is always perpendicular to the vertical direction.

Housing: As used in this disclosure, a housing is a rigid structure that encloses and protects one or more devices.

Inferior: As used in this disclosure, the term inferior refers to a directional reference that is parallel to and in the same direction as the force of gravity when an object is positioned or used normally.

Keyhole: As used in this disclosure, a keyhole refers to a negative space formed through a surface. The keyhole has a characteristic shape of a rectangle with a circle located at the narrow end of the rectangle. The diameter of the circle is greater than the span of the narrow end of the rectangle. The keyhole is used to secure an object to the surface. Specifically, the object has a disk shape mounted on an extension structure. The diameter of the disk is less than the diameter of the circle such that the disk will insert through the circle. The diameter of the disk is greater than the span of the narrow end of the rectangle such when the disk is slid underneath the rectangle the disk will not pass through the rectangle thereby securing the object to the surface. The size of the extension structure is selected such that the extension will slide into the rectangle. Use diameter, extension structure, disk, and cylinder.

Load: As used in this disclosure, the term load refers to an object upon which a force is acting or which is otherwise absorbing energy in some fashion. Examples of a load in this sense include, but are not limited to, a mass that is being moved a distance or an electrical circuit element that draws energy. The term load is also commonly used to refer to the forces that are applied to a stationary structure.

Load Path: As used in this disclosure, a load path refers to a chain of one or more structures that transfers a load generated by a raised structure or object to a foundation, supporting surface, or the earth.

Logic Module: As used in this disclosure, a logic module is a readily and commercially available electrical device that accepts digital and analog inputs, processes the digital and analog inputs according to previously specified logical processes and provides the results of these previously specified logical processes as digital or analog outputs. The disclosure allows, but does not assume, that the logic module is programmable.

Mount: As used in this disclosure, a mount is a mechanical structure that attaches or incorporates an object into a load path.

PPWN: As used in this disclosure, the PPWN is an acronym for a publically provided wireless network. The PPWN refers to a commercially provided and publicly available cellular wireless network.

Prism: As used in this disclosure, a prism is a three-dimensional geometric structure wherein: 1) the form factor of two faces of the prism are congruent; and, 2) the two congruent faces are parallel to each other. The two congruent faces are also commonly referred to as the ends of the prism. The surfaces that connect the two congruent faces are called the lateral faces. In this disclosure, when further description is required a prism will be named for the geometric or descriptive name of the form factor of the two congruent faces. If the form factor of the two corresponding faces has no clearly established or well-known geometric or descriptive name, the term irregular prism will be used. The center axis of a prism is defined as a line that joins the center point of the first congruent face of the prism to the center point of the second corresponding congruent face of the prism. The center axis of a prism is otherwise analogous to the center axis of a cylinder. A prism wherein the ends are circles is commonly referred to as a cylinder.

Reduction-Oxidation Reaction: As used in this disclosure, a reduction-oxidation reaction (also known as a redox reaction) is a chemical reaction involving the transfer of electrons between the reactants of the reaction.

Rigid Structure: As used in this disclosure, a rigid structure is a solid structure formed from an inelastic material that resists changes in shape. A rigid structure will permanently deform as it fails under a force.

Sensor: As used in this disclosure, a sensor is a device that receives and responds in a predetermined way to a signal or stimulus. As further used in this disclosure, a threshold sensor is a sensor that generates a signal that indicates whether the signal or stimulus is above or below a given threshold for the signal or stimulus.

SMS: As used in this disclosure, SMS is an abbreviation for short message service. The short message service is a service that is often provided with the cellular services that support personal data devices. Specifically, the SMS allows for the exchange of written messages between personal data devices. The SMS is commonly referred to as text messaging. A common enhancement of SMS is the inclusion of the delivery of multimedia services. This enhanced service is often referred to as Multimedia Media Services, which is abbreviated as MMS.

Smoke: As used in this disclosure, smoke refers to the suspension of particulate matter in the atmosphere. The presence of smoke often indicates a combustion reaction.

Speaker: As used in this disclosure, a speaker is an electrical transducer that converts an electrical signal into an audible sound.

Superior: As used in this disclosure, the term superior refers to a directional reference that is parallel to and in the opposite direction of the force of gravity when an object is positioned or used normally.

Suspend: As used in this disclosure, to suspend an object means to support an object such that the inferior end of the object does not form a significant portion of the load path of the object.

Suspension: As used in this disclosure, a suspension is a heterogeneous fluidic mixture containing items that will separate, often through sedimentation, over time.

Temperature: As used in this disclosure, temperature refers to a relative measure of the kinetic and vibrational energy contained in the atoms and molecules of a first object (or system) relative to the kinetic and vibrational energy contained in the atoms and molecules of a second object (or system). When two objects (or systems) are in thermal equilibrium, the temperature of the two objects (or systems) is the same.

Transducer: As used in this disclosure, a transducer is a device that converts a physical quantity, such as pressure or brightness into an electrical signal or a device that converts an electrical signal into a physical quantity.

Vertical: As used in this disclosure, vertical refers to a direction that is either: 1) perpendicular to the horizontal direction; 2) parallel to the local force of gravity; or, 3) when referring to an individual object the direction from the designated top of the individual object to the designated bottom of the individual object. In cases where the appropriate definition or definitions are not obvious, the second option should be used in interpreting the specification. Unless specifically noted in this disclosure, the vertical direction is always perpendicular to the horizontal direction.

Wireless: As used in this disclosure, wireless is an adjective that is used to describe a communication channel between two devices that does not require the use of physical cabling.

With respect to the above description, it is to be realized that the optimum dimensional relationship for the various components of the invention described above and in FIGS. 1 through 5 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A smoke detector comprising
a housing and a control circuit;
wherein the housing contains the control circuit;
wherein the smoke detector is an alarm;
wherein the smoke detector monitors the atmosphere for both smoke and for an increase in temperature consistent with the presence of a combustion reaction such as a fire;
wherein the smoke detector communicates an alarm message to an appropriate authority over a commercially provided and publicly available cellular wireless network;
wherein the alarm message informs the appropriate authority of the combustion reaction;
wherein the control circuit is an electric circuit;
wherein the control circuit monitors the atmosphere for smoke;
wherein the control circuit monitors the temperature of the atmosphere;
wherein the control circuit generates an audible alarm when the control circuit determines that an alarm condition exists;
wherein the alarm condition is determined by a factor selected from the group consisting of: a) the measured smoke in the atmosphere is consistent with a combustion reaction; b) the measured temperature of the atmosphere is consistent with a combustion reaction; and, c) the measured temperature of the atmosphere in combination with the measured temperature of the atmosphere is consistent with a combustion reaction;
wherein the control circuit transmits an SMS message containing an alarm message and the GPS coordinates of the control circuit to an appropriate authority when the control circuit determines that an alarm condition exists;
wherein the housing comprises a mounting surface, a battery, a battery chamber, and a circuit chamber;
wherein the mounting surface is an exterior Euclidean surface formed on the housing;
wherein the mounting surface is placed against a vertical surface that forms the load path that supports the load of the smoke detector;
wherein the battery chamber contains the battery
wherein the circuit chamber contains the control circuit;
wherein the control circuit comprises a logic module, a communication module, a GPS module, a smoke sensor, a temperature sensor, a speaker, and a wireless communication link;

wherein the logic module, the communication module, the GPS module, the smoke sensor, and the temperature sensor, and the speaker are electrically interconnected.

2. The smoke detector according to claim 1
wherein the housing is a rigid structure;
wherein the housing is a hollow structure.

3. The smoke detector according to claim 2
wherein the battery chamber is a space that is formed within the housing;
wherein the circuit chamber is a space that is formed within the housing.

4. The smoke detector according to claim 3 wherein the battery chamber contains the battery such that the battery can be removed and replaced as necessary.

5. The smoke detector according to claim 4 wherein each of the plurality of keyholes is a keyhole structure that is formed in the mounting surface.

6. The smoke detector according to claim 5 wherein the communication module creates the wireless communication link.

7. The smoke detector according to claim 6 wherein the battery converts chemical potential energy into the electrical energy used to power the control circuit.

8. The smoke detector according to claim 7
wherein the logic module is a programmable electronic device;
wherein the logic module initiates the transmission of an SMS message indicating an alarm condition and the GPS coordinates of the GPS module to the appropriate authority when an alarm condition is detected;
wherein the logic module transmits the SMS message to the appropriate authority using the communication module and the commercially provided and publicly available cellular wireless network.

9. The smoke detector according to claim 8
wherein the communication module is a wireless electronic communication device;
wherein the communication module allows the logic module to wirelessly communicate with the commercially provided and publicly available cellular wireless network;
wherein the communication module communicates SMS and MMS messages between the logic module and the appropriate authority through the commercially provided and publicly available cellular wireless network.

10. The smoke detector according to claim 9
wherein the GPS module is an electrical device;
wherein the GPS module communicates with the GPS to determine the GPS coordinates of the GPS module;
wherein the GPS module transfers the GPS coordinates to the logic module.

11. The smoke detector according to claim 10
wherein the smoke sensor is a sensor;
wherein the logic module controls the operation of the smoke sensor.

12. The smoke detector according to claim 11
wherein the logic module monitors the smoke sensor to determine the level of smoke in the atmosphere;
wherein the logic module determines whether an alarm condition exists based on the level of smoke measured in the atmosphere.

13. The smoke detector according to claim 12
wherein the temperature sensor is a sensor;
wherein the logic module controls the operation of the temperature sensor.

14. The smoke detector according to claim 13
wherein the logic module monitors the temperature sensor to determine the temperature of the atmosphere;
wherein the logic module determines whether an alarm condition exists based on the measured temperature of the atmosphere.

15. The smoke detector according to claim 14 wherein the speaker is a transducer.

16. The smoke detector according to claim 15
wherein the logic module controls the operation of the speaker;
wherein the speaker announces an audible alarm.

\* \* \* \* \*